United States Patent
Huang et al.

(10) Patent No.: US 10,096,543 B2
(45) Date of Patent: Oct. 9, 2018

(54) SEMICONDUCTOR CAPACITOR STRUCTURE FOR HIGH VOLTAGE SUSTAIN

(71) Applicant: MEDIATEK INC., Hsin-Chu (TW)

(72) Inventors: Chien-Kai Huang, Hsinchu County (TW); Yuan-Fu Chung, Changhua County (TW); Yuan-Hung Chung, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/748,161

(22) Filed: Jun. 23, 2015

(65) Prior Publication Data

US 2016/0049462 A1 Feb. 18, 2016

Related U.S. Application Data

(60) Provisional application No. 62/036,629, filed on Aug. 13, 2014.

(51) Int. Cl.
| | |
|---|---|
| *H01L 27/108* | (2006.01) |
| *H01L 29/76* | (2006.01) |
| *H01L 29/94* | (2006.01) |
| *H01L 23/522* | (2006.01) |
| *H01L 49/02* | (2006.01) |

(52) U.S. Cl.
CPC .......... *H01L 23/5223* (2013.01); *H01L 28/60* (2013.01); *H01L 28/88* (2013.01); *H01L 28/92* (2013.01); *H01L 2924/0002* (2013.01)

(58) Field of Classification Search
CPC ..... H01L 23/5223; H01L 28/60; H01L 28/88; H01L 28/92; H01L 27/10835; H01L 27/10808; H01L 27/10852; H01L 28/91

USPC ................ 257/300, 303, 306, 307
See application file for complete search history.

(56) References Cited

U.S. PATENT DOCUMENTS

| | | | | | |
|---|---|---|---|---|---|
| 5,583,359 | A | * | 12/1996 | Ng | H01L 23/5223 |
| | | | | | 257/306 |
| 7,485,912 | B2 | * | 2/2009 | Wang | H01G 4/005 |
| | | | | | 257/306 |
| 7,994,610 | B1 | | 8/2011 | Quinn | |
| 2007/0296013 | A1 | | 12/2007 | Chang | |
| 2011/0057293 | A1 | | 3/2011 | Tsai | |

(Continued)

FOREIGN PATENT DOCUMENTS

| | | |
|---|---|---|
| CN | 100438079 C | 10/2007 |
| CN | 102224588 A | 10/2011 |
| JP | 2001167968 A | 6/2001 |

*Primary Examiner* — Kimberly Rizkallah
*Assistant Examiner* — Dilinh Nguyen
(74) *Attorney, Agent, or Firm* — Wolf, Greenfield & Sacks, P.C.

(57) ABSTRACT

The present invention provides a semiconductor capacitor structure. The semiconductor capacitor structure comprises a first metal layer, a second metal layer and a first dielectric layer. The first metal layer is arranged to be a part of a first electrode of the semiconductor capacitor structure, and the first metal layer comprises a first portion and a second portion. The first portion is formed to have a first pattern, and the second portion is connected to the first portion. The second metal layer is arranged to be a part of a second electrode of the semiconductor capacitor structure, and the first dielectric layer is formed between the first metal layer and the second metal layer.

24 Claims, 9 Drawing Sheets

(56) References Cited

U.S. PATENT DOCUMENTS

2012/0092806 A1* 4/2012 Hua .................. H01L 23/5223
                                                    361/306.3
2014/0016245 A1* 1/2014 Bromer ................ B82Y 10/00
                                                    361/502

* cited by examiner

SEMICONDUCTOR CAPACITOR STRUCTURE FOR HIGH VOLTAGE SUSTAIN

CROSS REFERENCE TO RELATED APPLICATIONS

This application claims the benefit of U.S. Provisional Application No. 62/036,629, filed on Aug. 13, 2014 and included herein by reference.

BACKGROUND OF THE INVENTION

1. Field of the Invention

The present invention relates to a semiconductor capacitor structure, and more particularly, to a semiconductor capacitor structure with high capacitor density for high voltage sustain, which can be applied to a semiconductor process below or 28 nm.

2. Description of the Prior Art

In semiconductor manufacturing processes, metal capacitors constituted by metal-insulator-metal (MIM) capacitor structures are widely applied in Ultra Large Scale Integration (ULSI) designs. Due to their lower resistance, less significant parasitic effect, and absence of induced voltage shift in the depletion region, metal capacitors with MIM capacitor structure are usually adopted as the main choice of semiconductor capacitor designs.

However, since the manufacturing cost for the MIM capacitor structure is very expensive, mainly due to the additional photomask(s) required in the manufacturing process, and as the cost becomes more significant along with development of advanced semiconductor manufacturing process technologies, an interdigitated metal capacitor of metal-oxide-metal (MOM) structure, which only engages in the standard CMOS manufacturing process, has been developed in accordance with a requirement for a more economical semiconductor manufacturing process technology.

In a prior art, a multilevel interdigitated semiconductor capacitor structure is defined, wherein the multilevel interdigitated semiconductor capacitor structure includes at least a plurality of odd layers, a plurality of even layers, and a plurality of dielectric layers. The plurality of odd layers and the plurality of even layers comprise a first electrode and a second electrode. The first electrode in the plurality of odd layers is coupled to the first electrode in the plurality of even layers through a first bus. Likewise, the second electrode in the plurality of odd layers is coupled to the second electrode in the plurality of even layers through a second bus.

Figure 1:
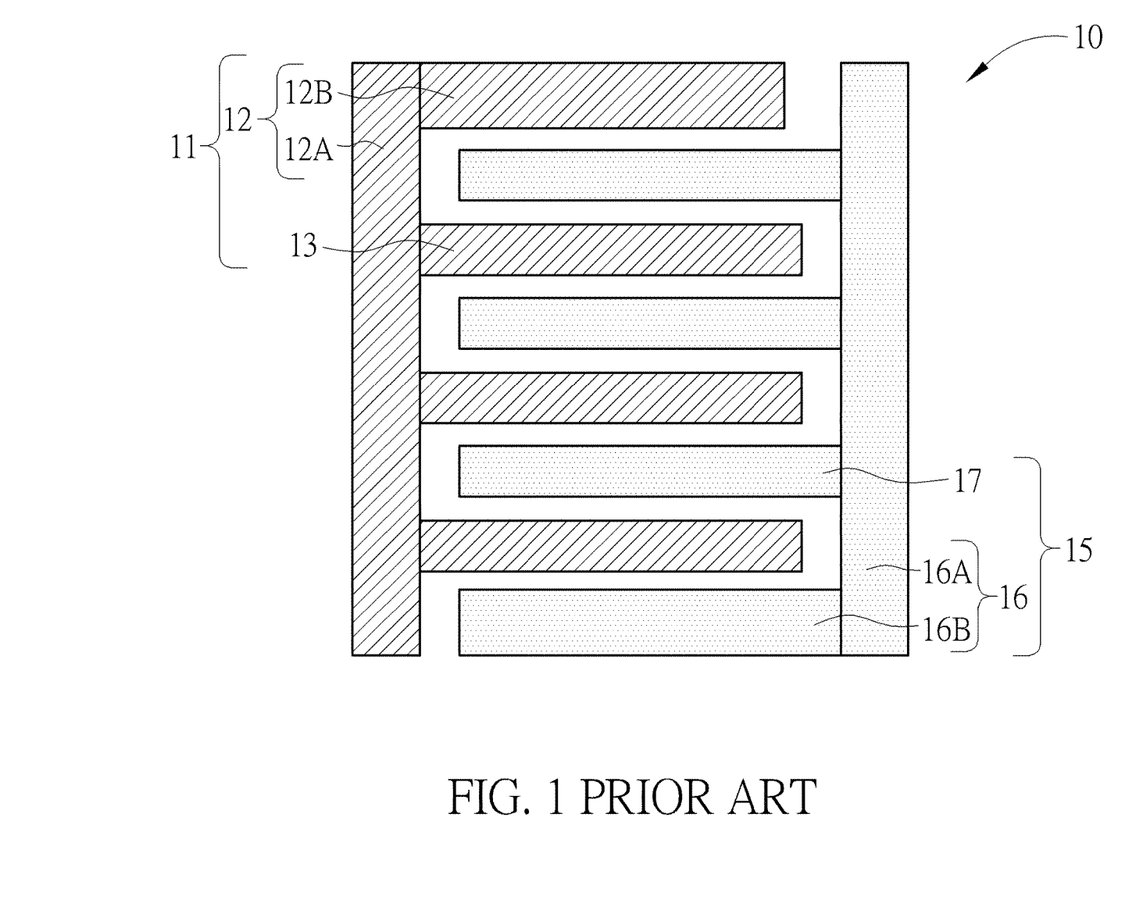
FIG. 1 is a simplified diagram of an odd layer of a conventional multilevel interdigitated semiconductor capacitor structure.
Figure 2:
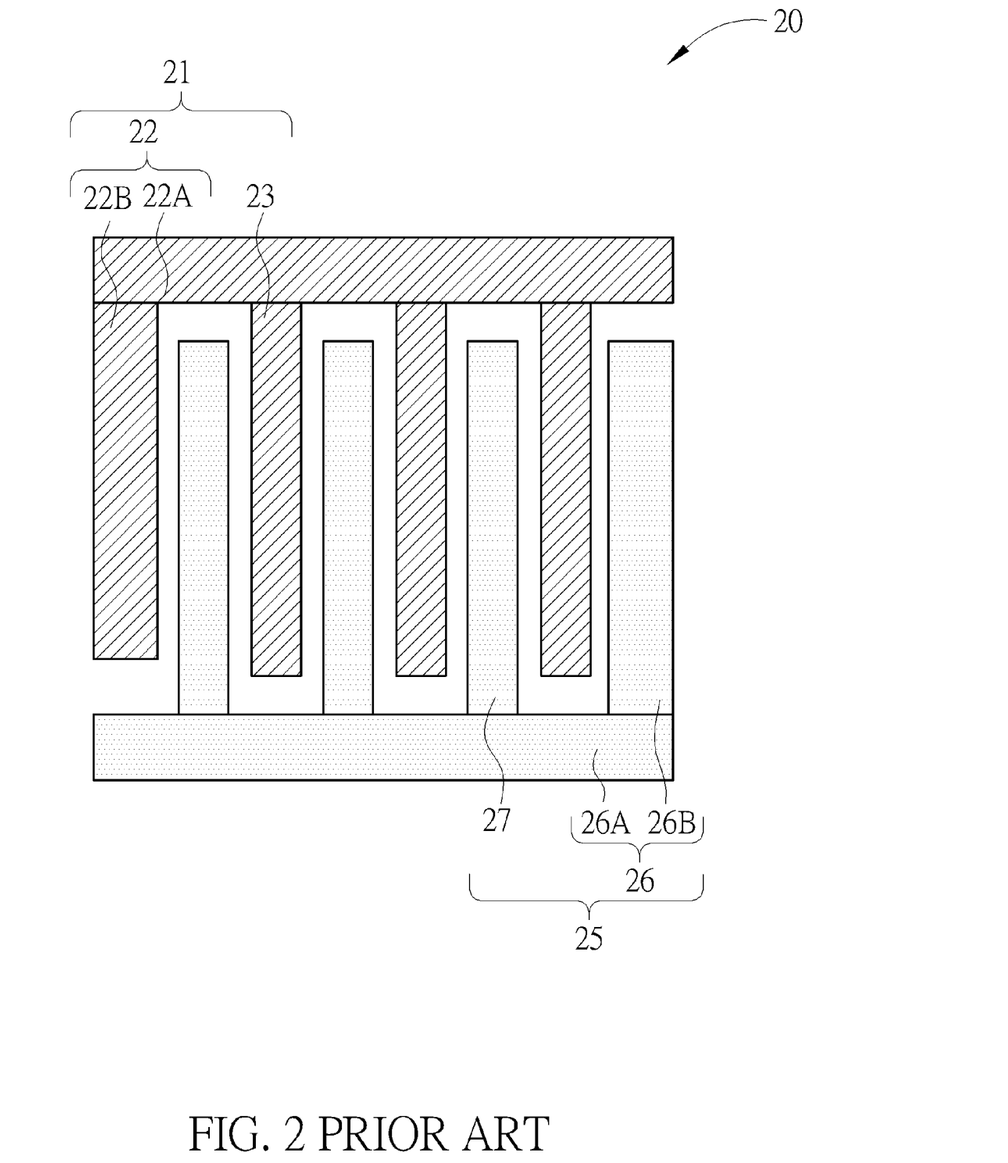
FIG. 2 is a simplified diagram of an even layer of the conventional multilevel interdigitated semiconductor capacitor structure.

Please refer to FIG. 1 and FIG. 2 together. FIG. 1 is a simplified diagram of an odd layer 10 of a conventional multilevel interdigitated semiconductor capacitor structure. FIG. 2 is a simplified diagram of an even layer 20 of the conventional multilevel interdigitated semiconductor capacitor structure. As shown in FIG. 1, the odd layer 10 comprises a first electrode 11 and a second electrode 15. The first electrode 11 includes a first section 12, and a plurality of second sections 13 arranged in parallel. The first section 12 includes a first portion 12A and a second portion 12B. The first portion 12A and the second portion 12B respectively constitute the two strokes of the L-shaped first section 12. The plurality of parallel-arranged second sections 13 join the first portion 12A of the first section 12, and are separated from one another by a predetermined distance. The second electrode 15 includes a first section 16, and a plurality of second sections 17 arranged in parallel. The first section 16 includes a first portion 16A and a second portion 16B. The first portion 16A and the second portion 16B respectively constitute the two strokes of the L-shaped first section 16. The plurality of parallel-arranged second sections 17 join the first portion 16A of the first section 16, and are separated from one another by a predetermined distance. The plurality of second sections 13 of the first electrode 11 and the plurality of second sections 17 of the second electrode 15 interdigitate with each other in parallel.

As shown in FIG. 2, the even layer 20 includes a first electrode 21 and a second electrode 25. The first electrode 21 includes a first section 22, and a plurality of second sections 23 arranged in parallel. The first section 22 includes a first portion 22A and a second portion 22B. The first portion 22A and the second portion 22B respectively constitute the two strokes of the L-shaped first section 22. The plurality of parallel-arranged second sections 23 join the first portion 22A of the first section 22, and are separated from one another by a predetermined distance. The second electrode 25 includes a first section 26, and a plurality of second sections 27 arranged in parallel. The first section 26 includes a first portion 26A and a second portion 26B. The first portion 26A and the second portion 26B respectively constitute the two strokes of the L-shaped first section 26. The plurality of parallel-arranged second sections 27 join the first portion 26A of the first section 26, and are separated from one another by a predetermined distance. The plurality of second sections 23 of the first electrode 21 and the plurality of second sections 27 of the second electrode 25 interdigitate with each other in parallel. The second section 13 of the first electrode 11 in FIG. 1 is perpendicular to the second section 23 of the first electrode 21 in FIG. 2.

However, in the conventional multilevel interdigitated semiconductor capacitor structure, since the dielectric parameter between the metal pitch (for example, the pitch between the second sections 13 of the first electrode 11 and the second sections 17 of the second electrode 15 in FIG. 1) is low (i.e. low k, such as 2.63), the metal pitch is required to be enlarged to achieve a better reliability (for example, the metal pitch is required to be 0.18 micrometers when the voltage is 6.6V), but it will cause huge capacitance decrease. In addition, due to the characteristics of the semiconductor process below 28 nm and the large voltage swing (such as 6V) in the PA design, an innovative semiconductor capacitor structure is required to fulfill the high voltage reliability issue (i.e. for high voltage sustain).

SUMMARY OF THE INVENTION

It is therefore one of the objectives of the present invention to provide a semiconductor capacitor structure with high capacitor density for high voltage sustain, which can be applied to a semiconductor process below 28 nm, to solve the above-mentioned problem.

In accordance with an embodiment of the present invention, a semiconductor capacitor structure is disclosed. The semiconductor capacitor structure comprises a first metal layer, a second metal layer and a first dielectric layer. The first metal layer is arranged to be a part of a first electrode of the semiconductor capacitor structure, and the first metal layer comprises a first portion and a second portion. The first portion is formed to have a first pattern, and the second portion is connected to the first portion. The second metal layer is arranged to be a part of a second electrode of the semiconductor capacitor structure, and the first dielectric layer is formed between the first metal layer and the second metal layer.

Briefly summarized, the semiconductor capacitor structure disclosed by the present invention can have high capacitor density for high voltage sustain and be applied to a semiconductor process below 28 nm. In addition, the reliability of inter different metal layers (IMD) dielectric is much better than the case in the dielectric of the same metal layer.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The semiconductor capacitor structures described in the embodiments of the present invention adopt the capacitor manufacturing technologies embodying metal-oxide-metal (MOM) capacitor structures, which do not require additional process cost above the standard CMOS manufacturing process, as a preferred realization scheme thereof. In other words, the capacitors in the embodiments of the present invention include metal layers as conductive material and oxide layers as dielectric material. As will be appreciated by those of ordinary skill in the pertinent art, however, the realization of the core concept of the present invention is not necessarily limited to the disclosed embodiments as hereinafter described. Other known or novel conductive materials or dielectric materials can also be applied to implement the capacitor structure of the present invention.

Figure 3:
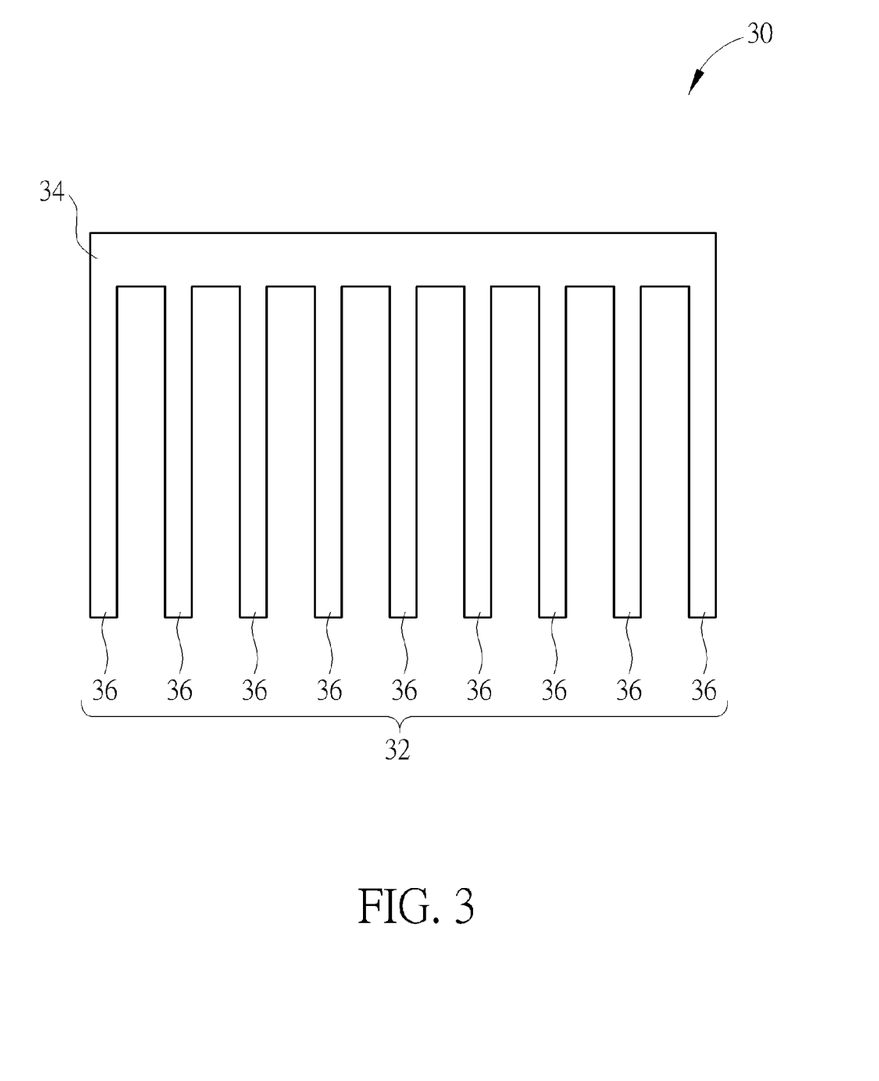
FIG. 3 is a simplified diagram of an odd metal layer of a semiconductor capacitor structure in accordance with a first embodiment of the present invention.
Figure 4:
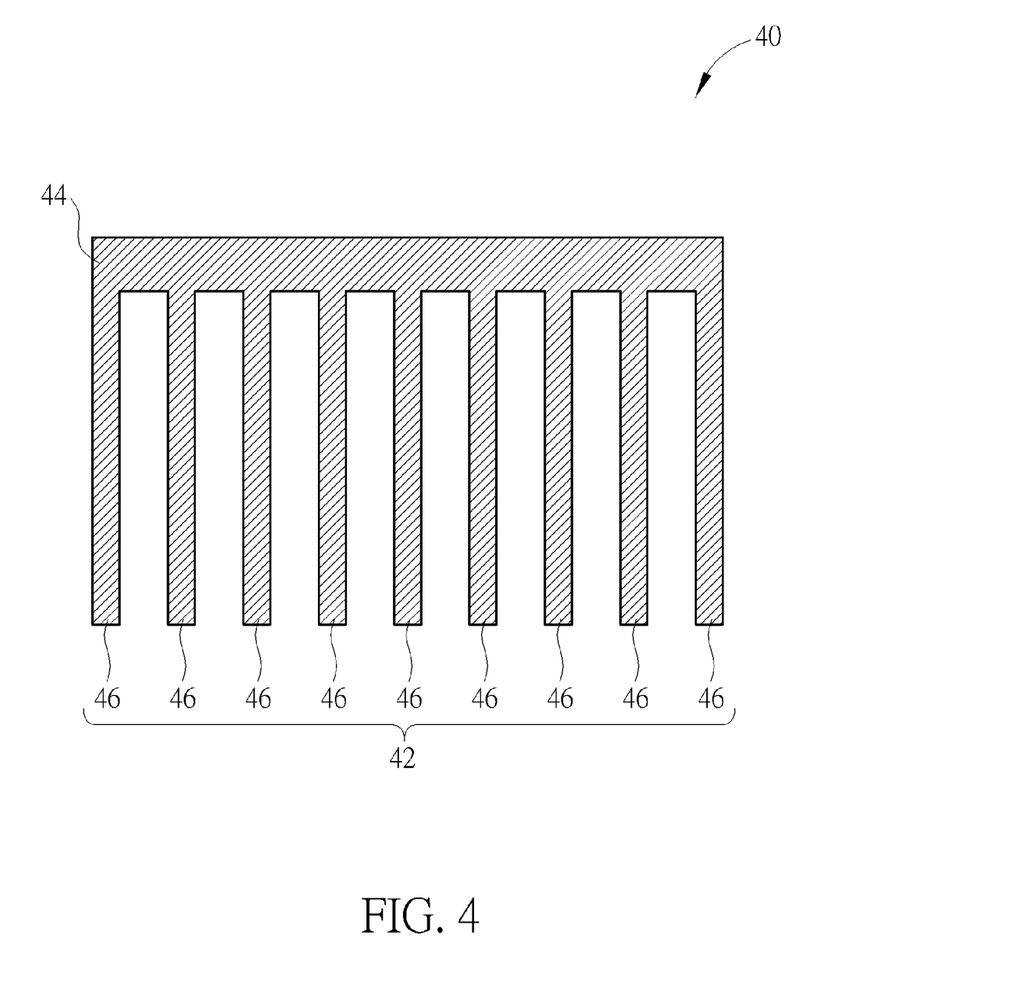
FIG. 4 is a simplified diagram of an even metal layer of the semiconductor capacitor structure in accordance with the first embodiment of the present invention.

Please refer to FIG. 3 and FIG. 4 together. FIG. 3 is a simplified diagram of an odd metal layer 30 of a semiconductor capacitor structure in accordance with a first embodiment of the present invention, and FIG. 4 is a simplified diagram of an even metal layer 40 of the semiconductor capacitor structure in accordance with the first embodiment of the present invention. In general, the semiconductor capacitor structure in accordance with the embodiment of the present invention is formulated by interlacing and stacking a plurality of odd metal layers 30 shown in FIG. 3 and a plurality of even metal layers 40 shown in FIG. 4. In other words, an even metal layer 40 is superimposed on top of an odd metal layer 30, and another odd metal layer 30 is further superimposed on top of the even metal layer 40, and this scheme continues in the same way in order to make up the semiconductor capacitor structure by interlacing and stacking a plurality of the odd metal layers 30 and a plurality of the even metal layers 40. In addition, an oxide layer is introduced as a dielectric layer between each of the odd/even metal layers 30 and its adjacent even/odd metal layers 40. A person of average skill in the pertinent art should understand that a single odd metal layer 30 and a single even metal layer 40 are sufficient to constitute a working semiconductor capacitor structure.

As shown in FIG. 3, the odd metal layer 30 is arranged to be a part of a first electrode (such as a cathode) of the semiconductor capacitor structure, and the odd metal layer 30 comprises a first portion 32 and a second portion 34, wherein the first portion 32 is formed to have a first pattern, and the second portion 34 is connected to the first portion 32. An oxide layer is utilized as a dielectric layer between the first portion 32 and the second portion 34. In this embodiment, the first portion 32 includes a plurality of sections 36 arranged in parallel to one another, and the sections constitute the first pattern (such as a square comb type pattern shown in FIG. 3). Please note that the above shapes and embodiments are only for illustration purposes and are not meant to be limitations of the present invention. For example, the first pattern can be changed to a polygon, an ellipse, or a circle according to different design requirements.

As shown in FIG. 4, the even metal layer 40 is arranged to be a part of a second electrode (such as a anode) of the semiconductor capacitor structure, and comprises a third portion 42 and a fourth portion 44 in this embodiment, wherein the third portion 42 is formed to have a second pattern, and the second portion 34 is connected to the first portion 32. The third portion 42 comprises a plurality of sections arranged in parallel to one another, and the sections constitute the second pattern (such as a square comb type pattern shown in FIG. 4). The third portion 42 has the same geometrical layout pattern implementation as the first portion 32 in the odd metal layer 30, and is aligned with and positioned above (and/or below) the first portion 32; the fourth portion 44 also has the same geometrical layout pattern implementation as the second portion 34 in the odd metal layer 30, and is aligned with and positioned above (and/or below) the second portion 34. In other words, the capacitor structure of the even metal layer 40 is a duplicate of the capacitor structure of the odd metal layer 30 in this embodiment, wherein the first portion 32 and the third portion 42 have vertical symmetry with each other, and the first pattern and the second pattern are the same. Please note that the above shapes and embodiments are only for illustration purposes and are not meant to be limitations of the present invention. For example, the second pattern can be changed to a polygon, an ellipse, or a circle according to different design requirements.

Figure 5:
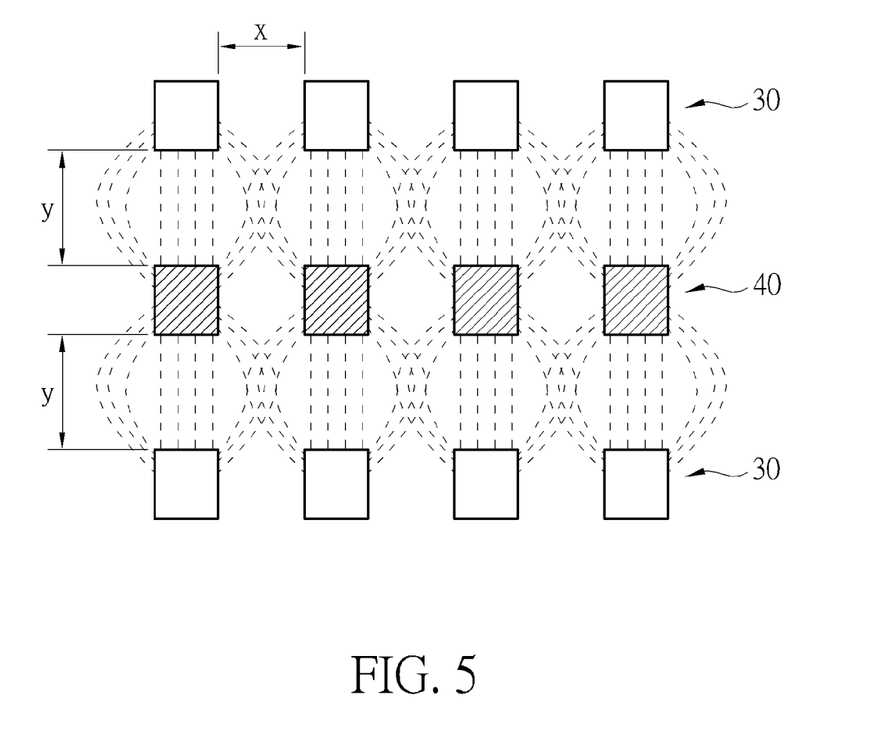
FIG. 5 is a simplified cross-sectional diagram of a semiconductor capacitor structure in accordance with the first embodiment of the present invention.

Please refer to FIG. 5. FIG. 5 is a simplified cross-sectional diagram of a semiconductor capacitor structure 100 in accordance with the first embodiment of the present invention. As shown in FIG. 5, the semiconductor capacitor structure 100 comprises two odd metal layers 30 and an even metal layer 40. The pitch x between the sections of the odd metal layers 30 and the even metal layer 40 can be 0.05 micrometers for example, and the width of the sections can be 0.09 micrometers for example. The pitch y between the odd metal layers 30 and the even metal layer 40 can be 0.07~0.095 micrometers for example. Please note that the above shapes and embodiments are only for illustration purposes and are not meant to be limitations of the present invention. For example, the number of the odd metal layer 30 and the even metal layer 40 can be changed according to different design requirements.

Figure 6:
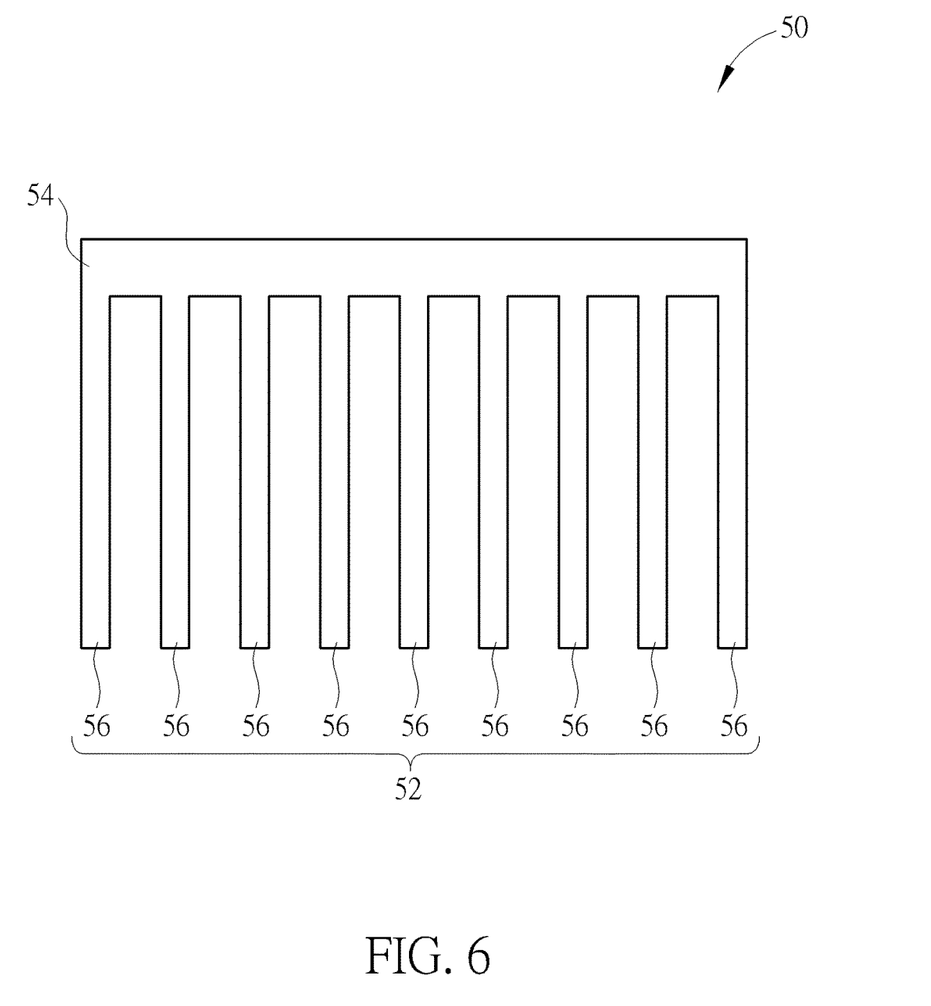
FIG. 6 is a simplified diagram of an odd metal layer of a semiconductor capacitor structure in accordance with a second embodiment of the present invention.
Figure 7:
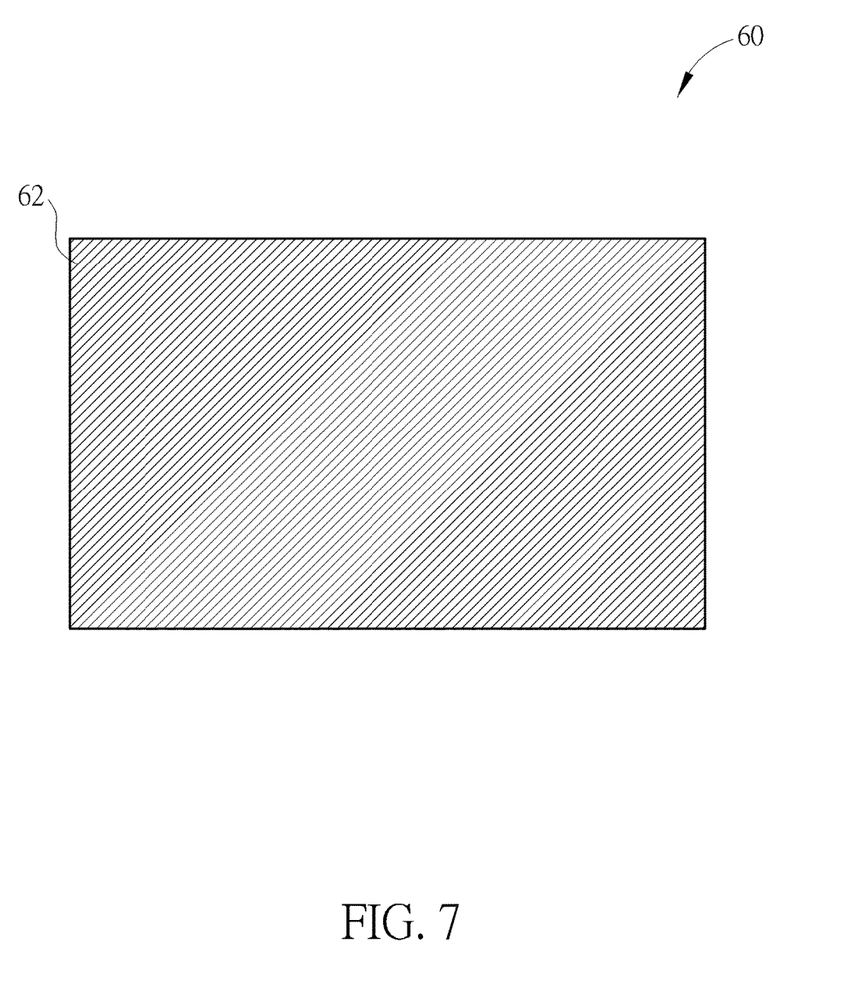
FIG. 7 is a simplified diagram of an even metal layer of the semiconductor capacitor structure in accordance with the second embodiment of the present invention.

Please refer to FIG. 6 and FIG. 7 together. FIG. 6 is a simplified diagram of an odd metal layer 50 of a semiconductor capacitor structure in accordance with a second embodiment of the present invention, and FIG. 7 is a simplified diagram of an even metal layer 60 of the semiconductor capacitor structure in accordance with the second embodiment of the present invention. In general, the semiconductor capacitor structure in accordance with the embodiment of the present invention is formulated by interlacing and stacking a plurality of odd metal layers 50 shown in FIG. 6 and a plurality of even metal layers 60 shown in FIG. 7. In other words, an even metal layer 60 is superimposed on top of an odd metal layer 50, and another odd metal layer 50 is further superimposed on top of the even metal layer 60, and this scheme continues in the same way in order to make up the semiconductor capacitor structure by interlacing and stacking a plurality of the odd metal layers 50 and a plurality of the even metal layers 60. In addition, an oxide layer is introduced as a dielectric layer between each of the odd/even metal layers 50 and its adjacent even/odd metal layers 60. A person of average skill in the pertinent art should understand that a single odd metal layer 50 and a single even metal layer 60 are sufficient to constitute a working semiconductor capacitor structure.

As shown in FIG. 6, the odd metal layer 50 is arranged to be a part of a first electrode (such as a cathode) of the semiconductor capacitor structure, and the odd metal layer 50 comprises a first portion 52 and a second portion 54, wherein the first portion 52 is formed to have a first pattern, and the second portion 54 is connected to the first portion 52. An oxide layer is utilized as a dielectric layer between the first portion 52 and the second portion 54. In this embodiment, the first portion 52 includes a plurality of sections 56 arranged in parallel to one another, and the sections constitute the first pattern (such as a square comb type pattern shown in FIG. 3). Please note that the above shapes and embodiments are only for illustration purposes and are not meant to be limitations of the present invention. For example, the first pattern can be changed to a polygon, an ellipse, or a circle according to different design requirements.

As shown in FIG. 7, the even metal layer 60 is arranged to be a part of a second electrode (such as a anode) of the semiconductor capacitor structure, and comprises a third portion 62 in this embodiment, wherein the third portion 62 is formed to have a second pattern (such as a square plate type pattern shown in FIG. 7). Please note that the above shapes and embodiments are only for illustration purposes and are not meant to be limitations of the present invention. For example, the second pattern can be changed to a polygon, an ellipse, or a circle according to different design requirements.

Figure 8:
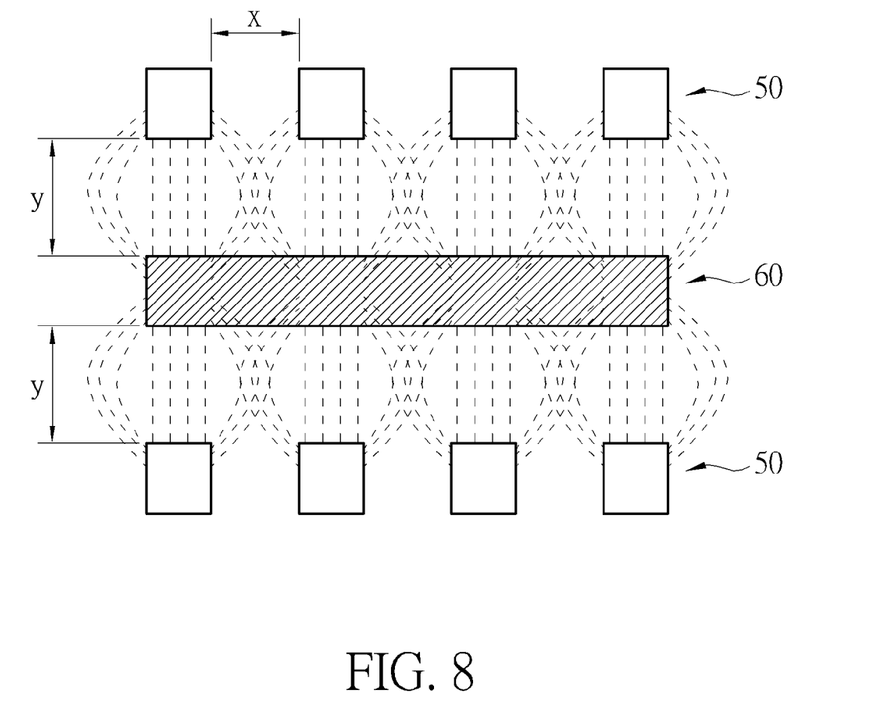
FIG. 8 is a simplified cross-sectional diagram of a semiconductor capacitor structure in accordance with the second embodiment of the present invention.

Please refer to FIG. 8. FIG. 8 is a simplified cross-sectional diagram of a semiconductor capacitor structure 200 in accordance with the second embodiment of the present invention. As shown in FIG. 8, the semiconductor capacitor structure 200 comprises two odd metal layers 50 and an even metal layer 60. The pitch x between the sections of the odd metal layers 50 can be 0.05 micrometers for example, and the width of the sections can be 0.09 micrometers for example. The pitch y between the odd metal layers 50 and the even metal layer 60 can be 0.07~0.095 micrometers for example. Please note that the above shapes and embodiments are only for illustration purposes and are not meant to be limitations of the present invention. For example, the number of the odd metal layer 50 and the even metal layer 60 can be changed according to different design requirements.

Figure 9:
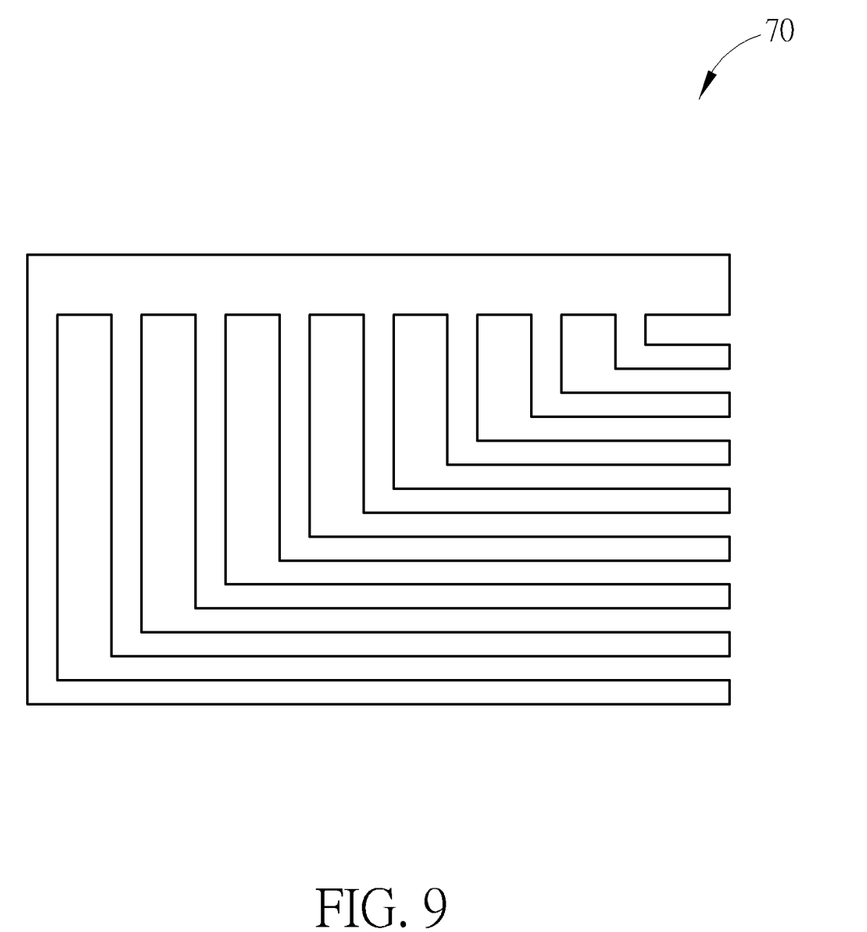
FIG. 9 is a simplified diagram of another metal layer in accordance with a third embodiment of the present invention.

In addition, the sections 36, 46, 56 in the above embodiments also can be changed to have turns in shape, as shown in FIG. 9 illustrating another metal layer 70 in accordance with a third embodiment of the present invention. Although the above embodiments illustrate a semiconductor capacitor structure developed along a square or rectangle type geometry, those of ordinary skill in the pertinent art should be able to understand that these embodiments are not meant to be limitations of the present invention. For example, the semiconductor capacitor structure can developed along a polygon (such as rhombus, hexagonal, octagonal) type geometry an elliptical type geometry, or a circular type geometry. Please note that the above shapes and embodiments are only for illustration purposes and are not meant to be limitations of the present invention.

In addition, please note that the material utilized by the odd metal layer 30, 50, the even metal layer 40, 60, and the metal layer 70 can be aluminum, copper, gold, or other metals or nonmetal materials in accordance with the differences in various semiconductor manufacturing processes, and alterations in the use of these materials should all fall within the scope of protection of the present invention.

The semiconductor capacitor structure of the present invention forms an oxide layer between the odd metal layer and the even metal layer, and forms and interlaces a plurality of oxide layers and a plurality of metal layers above the odd metal layer or below the even metal layer, so as to complete the MOM capacitor structure. In addition, due to improvements in semiconductor process technology, a significantly large number of metal layers can be stacked, and since the distance between the metal layers becomes smaller, a higher unit capacitance can be attained.

Briefly summarized, the semiconductor capacitor structure disclosed by the present invention can have high capacitor density for high voltage sustain and be applied to a semiconductor process below 28 nm. In addition, the reliability of inter different metal layers dielectric (IMD) is much better than the case in the dielectric of the same metal layer. For example, the dielectric parameter of the IMD can be about 12.43 when the pitch y between the odd metal layer and the even metal layer is 0.085 micrometers.

Those skilled in the art will readily observe that numerous modifications and alterations of the device and method may be made while retaining the teachings of the invention.

What is claimed is:

1. A semiconductor capacitor structure for high voltage sustain, comprising:
    a first metal layer in a first level of the semiconductor capacitor structure, arranged to be a part of a first electrode of the semiconductor capacitor structure, the first metal layer comprising:
        a first portion, formed to have a first pattern; and
        a second portion, connected to the first portion,
        wherein the first portion includes a plurality of sections protruding from the second portion;
    a second metal layer in a second level of the semiconductor capacitor structure above the first level, superimposed on top of the first metal layer, and arranged to be a part of a second electrode of the semiconductor capacitor structure;
    a first dielectric layer, formed between the first metal layer and the second metal layer: and
    a third metal layer in a third level of the semiconductor capacitor structure above the second level, superimposed on top of the second metal layer, and arranged to be a part of the first electrode of the semiconductor capacitor structure,
    wherein, within the semiconductor capacitor structure:
        the first and third levels do not include a portion of the second electrode, and
        the second level does not include a portion of the first electrode.

2. The semiconductor capacitor structure of claim 1, wherein the plurality of sections are arranged in parallel to one another, and the sections constitute the first pattern.

3. The semiconductor capacitor structure of claim 2, wherein the sections have turns.

4. The semiconductor capacitor structure of claim 2, wherein pitch between the sections is 0.05 micrometers, and width of the sections is 0.09 micrometers.

5. The semiconductor capacitor structure of claim 1, wherein the second metal layer comprises:
    a third portion, formed to have a second pattern; and
    a fourth portion, connected to the third portion.

6. The semiconductor capacitor structure of claim 5, wherein the first portion and the third portion have vertical symmetry with each other, and the first pattern and the second pattern are the same.

7. The semiconductor capacitor structure of claim 5, wherein the third portion comprises: a plurality of sections arranged in parallel to one another, and the sections constitute the second pattern.

8. The semiconductor capacitor structure of claim 7, wherein the sections have turns.

9. The semiconductor capacitor structure of claim 7, wherein pitch between the sections is 0.05 micrometers, and width of the sections is 0.09 micrometers.

10. The semiconductor capacitor structure of claim 7, wherein the sections in the first pattern overlap the sections in the second pattern.

11. The semiconductor capacitor structure of claim 5, further comprising: a second dielectric layer, formed between the third metal layer and the second metal layer.

12. The semiconductor capacitor structure of claim 5, wherein the second pattern is a polygon.

13. The semiconductor capacitor structure of claim 1, further comprising: a second dielectric layer, formed between the third metal layer and the second metal layer.

14. The semiconductor capacitor structure of claim 13, wherein the third metal layer comprises:
    a third portion, formed to have a second pattern; and
    a fourth portion, connected to the third portion.

15. The semiconductor capacitor structure of claim 14, wherein the third portion comprises: a plurality of sections arranged in parallel to one another, and the sections constitute the second pattern.

16. The semiconductor capacitor structure of claim 15, wherein the sections have turns.

17. The semiconductor capacitor structure of claim 15, wherein pitch between the sections is 0.05 micrometers, and width of the sections is 0.09 micrometers.

18. The semiconductor capacitor structure of claim 15, wherein the sections in the first pattern overlap the sections in the second pattern.

19. The semiconductor capacitor structure of claim 14, wherein the second pattern is a polygon.

20. The semiconductor capacitor structure of claim 1, wherein the first pattern is a polygon.

21. The semiconductor capacitor structure of claim 1, wherein the second metal layer is a plate.

22. The semiconductor capacitor structure of claim 1, wherein the semiconductor capacitor structure is a metal-oxide-metal (MOM) type capacitor structure.

23. The semiconductor capacitor structure of claim 1, wherein the semiconductor capacitor structure is applied to a semiconductor process below or 28 nm.

24. The semiconductor capacitor structure of claim 1, wherein pitch between the first metal layer and the second metal layer is 0.075~0.095 micrometers.

* * * * *